United States Patent [19]

Boss et al.

[11] Patent Number: 4,677,254

[45] Date of Patent: Jun. 30, 1987

[54] PROCESS FOR MINIMIZING DISTORTION IN MULTILAYER CERAMIC SUBSTRATES AND THE INTERMEDIATE UNSINTERED GREEN CERAMIC SUBSTRATE PRODUCED THEREBY

[75] Inventors: David W. Boss, Beacon; Derry J. Dubetsky, Wappingers Falls, both of N.Y.

[73] Assignee: International Business Machines Corporation, Armonk, N.Y.

[21] Appl. No.: 763,389

[22] Filed: Aug. 7, 1985

[51] Int. Cl.$^4$ .............................................. H05K 1/00
[52] U.S. Cl. ..................................... 174/68.5; 29/830; 264/61
[58] Field of Search ........................ 264/61; 174/68.5; 29/830; 361/382; 357/82

[56] References Cited

U.S. PATENT DOCUMENTS 3,770,529 11/1973 Anderson ...................... 174/68.5 X
3,879,509 4/1975 Elderbaum ..................... 264/61 X
4,237,606 12/1980 Niwa et al. ................... 174/68.5 X Primary Examiner—Morris H. Nimmo
Attorney, Agent, or Firm—Wolmar J. Stoffel

[57] ABSTRACT

A method of fabricating a multilayer ceramic substrate with an internal conductive metallurgy circuit network, wherein additional green sheet material is added to the stack of ceramic green sheets during assembly to areas of the substrate outside of the conductive metallurgy to compensate for the volume of conductive metal paste to thereby eliminate or minimize substrate distortion during the sintering operation. An unsintered intermediate green ceramic substrate made up of green ceramic sheets with via holes and conductive metal lines on the surface which collectively form the circuit network where the improvement is additional green ceramic material in the substrate in areas outside of the conductive metallurgy network to compensate for the additional volume of material of the conductive metal which additional material provides a more uniform ceramic material density through the substrate.

17 Claims, 6 Drawing Figures

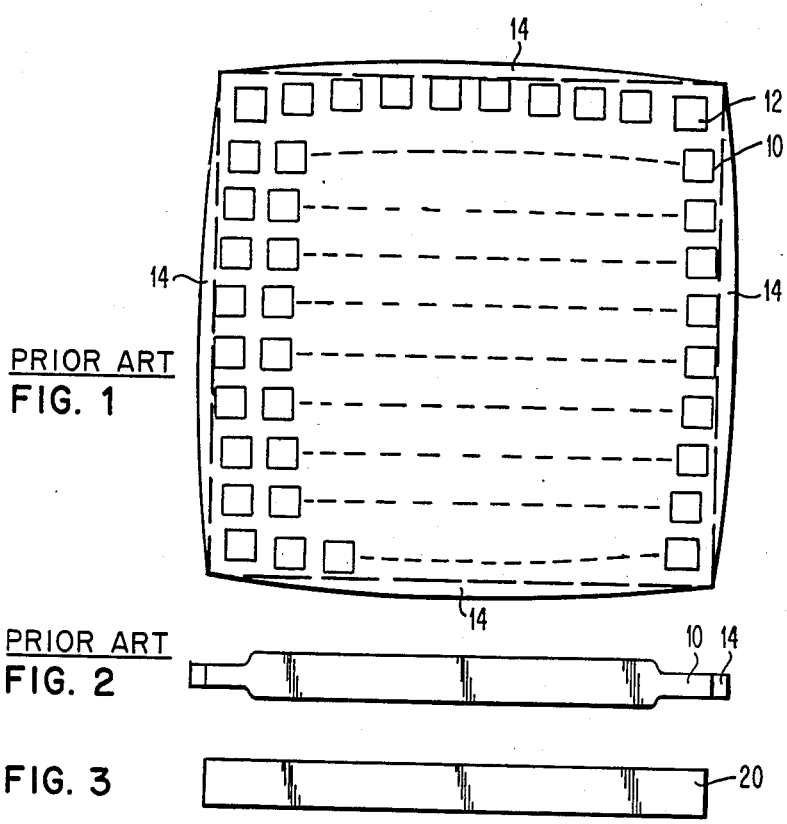
PRIOR ART
FIG. 1
PRIOR ART
FIG. 2
FIG. 3
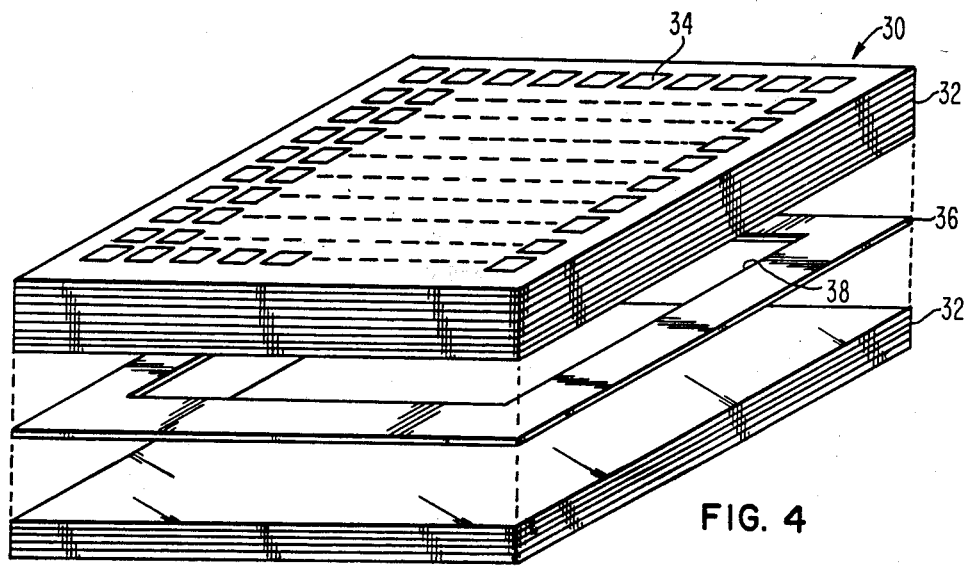
FIG. 4

PROCESS FOR MINIMIZING DISTORTION IN MULTILAYER CERAMIC SUBSTRATES AND THE INTERMEDIATE UNSINTERED GREEN CERAMIC SUBSTRATE PRODUCED THEREBY

FIELD OF INVENTION

This invention relates to ceramic substrates for integrated circuit semiconductor packages, more particularly to methods for preventing distortion in laminated ceramic substrates, still more particularly to a process for eliminating or minimizing distortion of multilayer ceramic substrates used for semiconductor packages.

BACKGROUND OF INVENTION

Because of the high package density attainable with multilayer ceramic (MLC) substrate circuit structure, it has achieved extensive acceptance in the electronics industry for the packaging of integrated circuit semiconductor devices and other elements. In general, such conventional ceramic structures are formed from ceramic green sheets which are prepared from ceramic slurry. The slurry is made by mixing a ceramic particulate, a thermoplastic polymer (e.g. polyvinylbutyral) and solvents for the polymer. This slurry is then cast or doctor bladed into ceramic sheets from which the solvents are subsequently volatilized to provide a coherent and self-supporting flexible green sheet, which may be finally fired to drive off the binder resin and sinter the ceramic particulates together into a densified ceramic unitary substrate.

In the fabrication of multilevel ceramic structure, the green sheets are first punched to form via holes. Subsequently, a pattern of conductive material is deposited in the via holes and on the surfaces of the sheets. The green sheets are then assembled in the proper order and laminated wherein the metallurgy in the via holes and on the green sheets collectively form a complex internal metallurgy network. After the composite substrates have been pressed to adhere the sheets firmly together and indent the conductive metal patterns into the opposed sheets, the substrate is fired in an appropriate atmosphere at a temperature to first burn off the organic binder, and subsequently to sinter the particles of the substrate together to form a unitary ceramic substrate. The original green ceramic sheets are formed on a larger scale so that upon shrinking the spacing of the various elements conforms to the desired standards. The fabrication of multilayer ceramic substrates is described in more detail in U.S. Pat. No. 4,245,273. In the manufacture of multilayer ceramic substrates for integrated circuit semiconductor packages, it is imperative that shrinkage that occurs during the sintering operation be predictable and consistent, and also that the shrinkage be uniform throughout the multilayer ceramic substrate. Further, the stresses and material changes generated by the lamination process operate to cause variability during sintering.

SUMMARY OF THE INVENTION

An object of this invention is to achieve a shrinkage during sintering of an MLC substrate that is uniform throughout the substrate.

Another object of the invention is to achieve a stable planar sintered substrate free of warpage, and where the original geometric shape is retained.

Another object of this invention is to provide a method of producing an MLC substrate that is free of warpage, and where the original geometric shape is retained.

Yet another object of this invention is to provide an intermediate product, i.e. a green ceramic substrate that will have a uniform shrinkage throughout the substrate, be free of warpage, and retain its original geometric shape during the sintering operation.

In accordance with the aforementioned objects of the invention, a method is presented for fabricating a multilayer ceramic substrate with an internal conductive metallurgy circuit wherein a slurry of particulate ceramic material, an organic binder, and a solvent for the binder is formed into a green ceramic sheet, holes punched in the sheets, conductive metal deposited in the via holes and on the surface of the sheets to form lines, a plurality of the green sheets assembled, and the resultant substrate sintered, the improvement involving incorporating additional green ceramic material in the substrate during assembly in the areas generally outside of the areas of the conductive metal lines and filled via holes, subjecting the resultant substrate to pressure to laminate the sheets, and sintering the resultant substrate. The added green sheet material acting to compensate for the additional volume of the conductive metal paste in the substrate forming the metallurgy system.

BRIEF DESCRIPTION OF THE DRAWINGS

The invention, both as to its modes of practice and organization, together with the further objects and advantages thereof may be best appreciated by reference to the following detailed description taken in conjunction with the drawings wherein FIG. 1 is a top view of a multilayer ceramic substrate illustrating the shape after sintering in greatly exaggerated dimensions.

FIG. 2 is a side view of the substrate illustrated in FIG. 1, showing the distortion also in exaggerated scale.

FIG. 3 is a side view of a sintered multilayer ceramic substrate formed by the method of this invention illustrating a relatively distortion-free profile shape.

FIG. 4 is a perspective view in exploded relation of a laminated substrate formed of green ceramic sheets illustrating one embodiment of a means of compensating with additional ceramic material.

DESCRIPTION OF PREFERRED EMBODIMENTS

Figure 5:
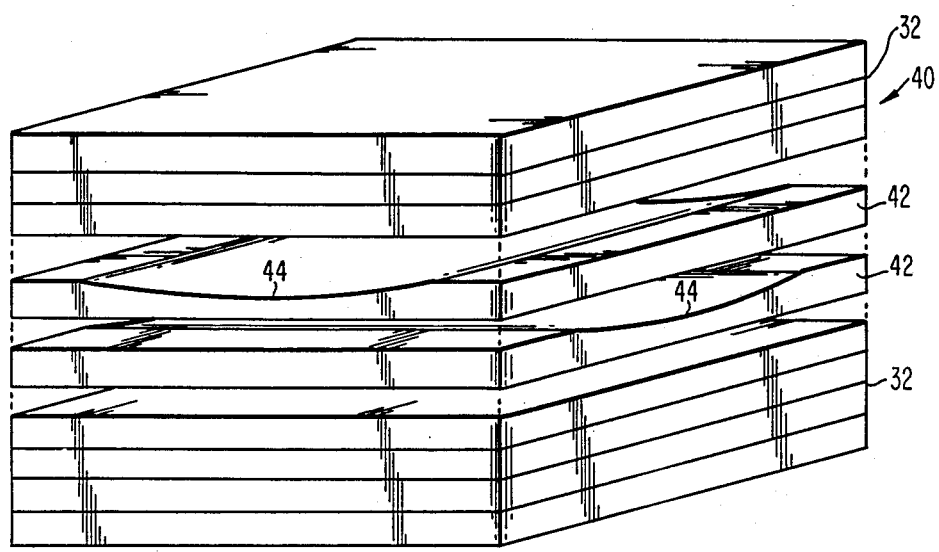
FIG. 5 is another perspective view of a stack of green ceramic sheets illustrating another embodiment of the invention for compensating with ceramic material.

Referring now to the Figures of the drawing, in particular FIGS. 1 and 2, there is illustrated the general shape, in greatly exaggerated scale, of a substrate fabricated by techniques conventional in the art. The centrally located green ceramic sheet of a typical MLC substrate has via holes punched, filled with conductive paste, and surface lines formed of conductive material that joins the via. Also in power planes, an almost solid layer of paste may be deposited on the sheet. These vias and surface patterns are located generally in the central area of the substrate, in general underlying device pads 12 on substrate 10 as shown in FIG. 1. In the border area outside of the device pads 12, there are normally no vias or conductive patterns. When the green ceramic sheets are assembled and laminated, i.e., placed in a press and subjected to pressure, the ceramic material in the centrally located volume of the substrate is compacted to a greater degree than the volume of the substrate without metallurgy, and the density of the ceramic material is greater. While there is some plastic flow of the ceramic material to the volume of the substrate without metallurgy, the flow is not sufficient to equalize the density of the ceramic material. This increased density is not evident in the laminated green ceramic substrate since it conforms to the shape of the press cavity. However, when the substrate is sintered the geometric shape changes to the shape illustrated in FIGS. 1 and 2, the sides of the substrate bulge as indicated in exaggerated scale by volumes 14. In addition, the edges become tapered, as indicated in Fig. 2, also in exaggerated scale.

Substrate 10 is thus distorted in the X and Y directions, which complicates placement of devices on pads 12 on the surface pattern. It makes testing the substrate for electrical internal defects difficult since the probes must be placed over and contact the pad pattern. When the top surface metallurgy pattern is distorted, fewer contact points can be made at a time. If the pattern is undistorted, theoretically all the pads could be contacted at once. The greater the distortion the fewer electrical contacts can be made.

As indicated in FIG. 2, the substrate is also distorted in the Z direction. This distortion also complicates testing the substrate for electrical defects. The pads along the edge are lower than the inner pads. The contact probe may fail to establish electrical contact with the outer pad since the probe will contact the inner pad first and prevent the probe from descending to the level of the outer pads. The seal that ultimately will be established between the substrate and cap may also be impacted because of this surface irregularity. Still further, the top surfaces of the outermost devices bonded to the substrate will not be in the same plane as the inner devices. When the conduction pistons as disclosed in U.S. Pat. No. 3,993,123 are used to cool the devices, the cooling efficiency is impacted because the piston is tilted relative to the surface, thus limiting the area contact.

When the stack of green ceramic sheets is laminated in a press, the flow of ceramic material caused by the application of pressure moves the center layers outwardly. This essentially bows the vertical lines of the internal metallurgy outwardly where the bow is greatest along the outer peripheral areas. the The aforementioned problems become more serious as the number of sheets in the substrate increase since the complexity of the substrate is increasing. Due to increased microminiaturization of the device geometry, the number of sheets in a substrate will increase which will also increase the problems associated therewith.

FIG. 3 illustrates the desired profile of a sintered multilayer ceramic substrate 20, which can be achieved by this invention. The substrate claimed is substantially free of distortion in the X, Y and Z directions.

Referring now to FIG. 4 there is illustrated a first preferred embodiment of the method of the invention. FIG. 4 shows an unsintered multilayer ceramic substrate 30 formed of green ceramic sheets 32, formed in accordance with known methods. The top sheet has a suitable surface metallurgy pattern 34 (shown schematically) adapted to provide electrical connections to a plurality of semiconductor devices. In order to compensate for the volume of conductive metal paste in the central area of sheets 32, a sheet 36 is disposed in the stack of sheets. Sheet 36 is preferably formed of the same ceramic material as sheet 32, but has a large central opening 38. Generally, the opening 38 corresponds to the area provided on sheets 32 for vias and conduction metallurgy patterns. Thus, the use of sheet 36 does not require vias or conductive patterns to be formed thereon. Any suitable number of sheets 36 can be placed internally or externally in the stack of sheets 30 in order to minimize or eliminate density variations in the laminated substrate. The sheet 36 can have the same thickness as sheets 32 or it can be thicker or thinner depending on the need. The number of sheets 36 in the substrate can be determined by trial and error, and is dependent on the nature of the conductive metal paste, the paste thickness and the total number of sheets in the substrate being fabricated.

Referring now to FIG. 5, there is illustrated another embodiment of the invention. FIG. 5 shows a stack 40 of green ceramic sheets 32 formed in accordance with known methods. Sheets 32 have via holes (not shown) filled with conductive metal paste, and metallurgy patterns (not shown) which collectively form an internal metallurgy pattern for an MLC substrate. Inserted in the stack 40 are two sheets 42 with a thinned central portion 44. The sheets 44 are preferably positioned with the direction of casting at right angles to each other. Sheets 42 can be conveniently formed by doctor blading, where the doctor blade is shaped to the compliment of the desired sheet profile. As in the previous method embodiment, the number of sheets inserted in the substrate can vary to meet the individual substrate requirements. Sheets 42 must have via holes punched and filled with conductive metal paste to join the metallurgy patterns on the associated green sheets 32.

Figure 6:
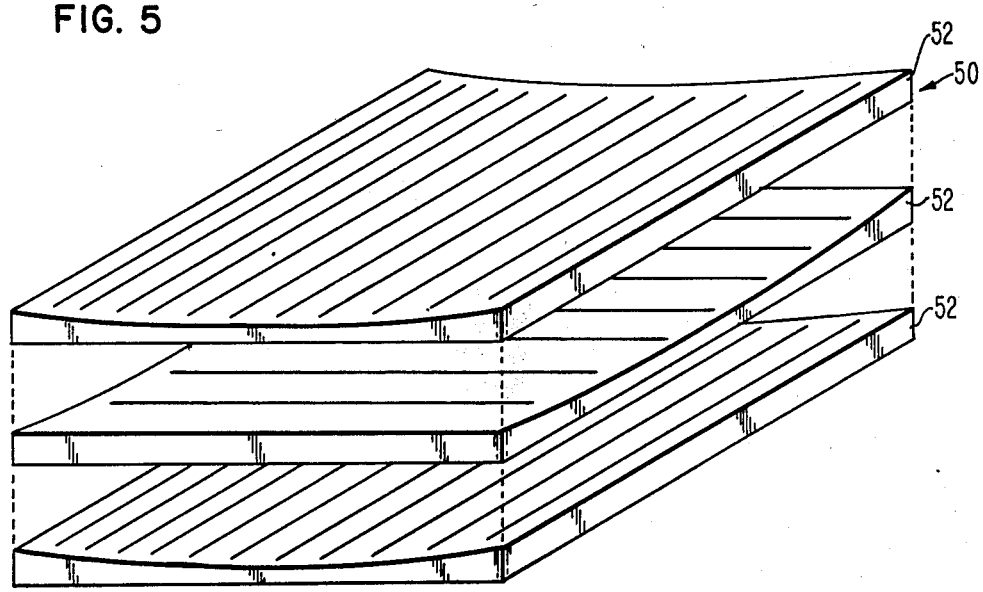
FIG. 6 is a perspective view of a plurality of green ceramic sheets in exploded relation illustrating yet another preferred specific embodiment of the invention for introducing additional ceramic material to compensate for the metallurgy pattern.

Referring now to FIG. 6 of the drawing, there is illustrated yet another embodiment of the invention. FIG. 6 shows a stack 50 of green ceramic sheets 52. Sheets 52 each have a profile designed to compensate for conductive metal paste on,the sheets and in the via holes. Here the profiled sheets 52 have via holes (not shown) with conductive metal paste, and conductive lines (not shown) that collectively form an internal metallurgy system. Since the profile variation of sheets 52 vary only slightly from the flat sheets 32 in FIGS. 4 and 5, the conventional punching and screening present no significant problem. The stack of green sheets 50 shown in FIG. 6 thus are comprised of uniformly shaped green sheets with a thinned central profile. As indicated, the direction of casting which corresponds to the profile is varied with each sheet where the direction is advanced 90° relative to the preceding sheet.

In the practice of the invention, any suitable ceramic material combined with an appropriate organic binder and solvent for the binder can be used including alumina ceramic, mullite, glass ceramic, etc. After the stacks of green ceramic sheets have been assembled, they are laminated i.e. pressed between two platens, preferably with a confining edge.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. In a method of fabricating a multilayer ceramic substrate with an internal conductive metallurgy circuit network wherein a slurry of particulate ceramic material, an organic binder and a solvent for the binder is formed into green ceramic sheets punched into the sheets, conductive metal material deposited in the via holes and on the surface of the sheets to form lines, a plurality of green ceramic sheets assembled and laminated, and the resultant substrate sintered, the improvement comprising, incorporating additional green ceramic material in the substrate during assembly in the areas generally outside of the areas of conductive metal lines and filled via holes, subjecting the resultant substrate to pressure to laminate the sheets, and sintering the resultant substrate, said added green sheet material compensating for the volume of the conductive metal material to thereby achieve a more uniform density of green ceramic material throughout the substrate, which reduces dimensional distortion of the substrate after sintering.

2. The method of claim 1 wherein said additional green ceramic material is incorporated in said substrate by forming an opening in the central area of at least one sheet of green ceramic material, and placing the resultant at least one green ceramic sheet with a central opening with said plurality of green ceramic sheets as they are assembled.

3. The method of claim 2 wherein said central opening is a rectangular or square opening.

4. The method of claim 3 wherein said at least one green ceramic sheet is placed in the center of the resultant stack of said plurality of green ceramic sheets during assembly.

5. The method of claim 3 wherein said at least one green ceramic sheet is placed on the bottom of the resultant stack of said plurality of green ceramic sheets during assembly.

6. The method of claim 3 wherein said central opening in said at least one green ceramic sheet approximately.encompasses said conductive metal lines on the associated said plurality of green sheets.

7. The method of claim 1 wherein said additional green ceramic material is incorporated in said substrate by forming at least one green ceramic sheet with profile having a thinner central portion, forming via holes in said sheet and filling with conductive metal material, placing the resultant at least one green ceramic sheet with said plurality of green ceramic sheets as they are assembled.

8. The method of claim 7 wherein said at least one green ceramic sheet is formed by doctor blading a ceramic slurry with a doctor blade with a shape that is complimentary to the desired profile.

9. The method of claim 8 wherein two ceramic sheets, each with a thinner central profile, are placed in the resultant stack of said plurality of green ceramic sheets, said ceramic sheets arranged with said profiles orthogonal to each other.

10. The method of claim 1 wherein said additional green ceramic material is incorporated in said substrate by said plurality of green ceramic sheets with a sheet profile having a thinned central section, and wherein said sheets contain via holes filled with conductive metal material, and lines on the surface, said profile shape of said plurality of green ceramic sheets acting to compensate for the conductive metal paste in the central areas of the sheets.

11. The method of claim 10 wherein said green ceramic sheets are formed by doctor blading a ceramic slurry with a doctor blade provided with a shape that is complimentary to the desired profile.

12. The method of claim 11 wherein said plurality of green ceramic sheets are assembled with said profiles of the sheets arranged orthogonally to the adjacent sheet.

13. In an unsintered multilayer ceramic substrate with an internal conductive metallurgy circuit network made of green ceramic sheets with via holes and conductive metal lines of conductive metal materail on the surfaces which collectively form the circuit network, the improvement comprising green ceramic material in the substrate in areas outside of the areas of the conductive metallurgy network to compensate for the additional volume of.material of the conductive metal to thereby achieve a more uniform ceramic material density throughout the substrate which reduces dimensional distortion of the substrate after sinistering.

14. The ceramic substrate of claim 13 which includes at least one ceramic sheet with a central opening.

15. The ceramic substrate of claim 14 wherein said ceramic sheet with a central opening is located on the bottom of the substrate.

16. The ceramic substrate of claim 13 which includes at least one green ceramic sheet with a profile having a thinner central portion.

17. The ceramic substrate of claim 13 wherein said green ceramic sheets have a profile with a thinner central portion, said sheets assembled so that the profiles of the sheets are arranged orthogonal to the adjacent sheet.

* * * * *

UNITED STATES PATENT AND TRADEMARK OFFICE
CERTIFICATE OF CORRECTION

PATENT NO. : 4,677,254
DATED : June 30, 1987
INVENTOR(S) : D.W. BOSS & D.J. DUBETSKY It is certified that error appears in the above-identified patent and that said Letters Patent is hereby corrected as shown below:

Claim 7, Col. 5, line 52, after "with" insert --a--

Claim 10, Col. 6, line 20, please delete "paste" and insert "material".

Signed and Sealed this

Third Day of November, 1987

Attest:

DONALD J. QUIGG

Attesting Officer

Commissioner of Patents and Trademarks